(12) United States Patent
Lee et al.

(10) Patent No.: US 6,919,745 B2
(45) Date of Patent: Jul. 19, 2005

(54) RING-RESISTER CONTROLLED DLL WITH FINE DELAY LINE AND DIRECT SKEW SENSING DETECTOR

(75) Inventors: Seong-Hoon Lee, Gyeonggi-do (KR); Jun-Hong Ahn, Kyoungki-do (KR); Joo-Sun Choi, Icheon-si (KR)

(73) Assignee: Hynix Semiconductor Inc., Ichon-shi (KR)

( * ) Notice: Subject to any disclaimer, the term of this patent is extended or adjusted under 35 U.S.C. 154(b) by 42 days.

(21) Appl. No.: 10/635,913

(22) Filed: Aug. 7, 2003

(65) Prior Publication Data

US 2004/0201406 A1 Oct. 14, 2004

(Under 37 CFR 1.47)

Related U.S. Application Data

(63) Continuation of application No. 10/073,358, filed on Feb. 13, 2002, now abandoned.

(30) Foreign Application Priority Data

Aug. 8, 2001 (KR) ........................................ 2001-47763

(51) Int. Cl.[7] .............................................. H03L 7/06
(52) U.S. Cl. ........................................ 327/149; 327/158
(58) Field of Search ................................ 327/147, 149, 327/151, 153, 158, 156, 160, 161, 163

(56) References Cited

U.S. PATENT DOCUMENTS

| 5,440,515 A | 8/1995 | Chang et al. ................. 365/194 |
| 5,448,193 A | 9/1995 | Baumert et al. ............. 327/156 |
| 5,534,809 A | * 7/1996 | Watanabe et al. ............ 327/269 |
| 5,610,543 A | 3/1997 | Chang et al. ................. 327/158 |
| 5,740,115 A | 4/1998 | Ishibashi et al. ............ 365/203 |
| 5,796,673 A | 8/1998 | Foss et al. ................... 365/233 |
| 5,930,182 A | 7/1999 | Lee ............................. 365/194 |
| 5,995,443 A | 11/1999 | Farmwald et al. ........... 365/233 |
| 6,026,051 A | 2/2000 | Keeth et al. ................. 365/233 |
| 6,034,918 A | 3/2000 | Farmwald et al. ........... 365/233 |
| 6,038,195 A | 3/2000 | Farmwald et al. ........... 365/233 |
| 6,060,928 A | * 5/2000 | Jun et al. ..................... 327/261 |
| 6,072,743 A | 6/2000 | Amano et al. ............. 365/230.03 |
| 6,072,846 A | 6/2000 | Kyung et al. ................. 375/354 |
| 6,081,145 A | 6/2000 | Bandai et al. ................ 327/231 |
| 6,081,462 A | 6/2000 | Lee ............................. 365/194 |
| 6,101,137 A | 8/2000 | Roh ............................. 365/194 |
| 6,101,152 A | 8/2000 | Farmwald et al. ........... 365/233 |
| 6,437,618 B2 | 8/2002 | Lee ............................. 327/158 |

FOREIGN PATENT DOCUMENTS

| JP | 11-065699 | 3/1999 |
| JP | 11-120768 | 4/1999 |
| JP | 11-298463 | 10/1999 |
| JP | 2000-076852 | 3/2000 |

OTHER PUBLICATIONS

Lee et al., "A Ring Register Controlled Delay Locked Loop," The 8th Korean Conference on Semiconductors, Feb. 14, 2001, pp. 501–504.

* cited by examiner

Primary Examiner—Linh My Nguyen
(74) Attorney, Agent, or Firm—Pillsbury Winthrop Shaw Pittman LLP

(57) ABSTRACT

The present invention related to a ring-resister controlled DLL with fine delay line and a direct skew sensing detector, which is applicable to circuitry for compensating skew between external and internal clocks. The ring-register controlled delay locked loop according to the present invention comprises: a first delay group including a plurality of unit delay elements which are lineally coupled to each other for delaying an input clock signal; a second delay group including a plurality of unit delay elements which are circularly coupled to each other for delaying an output signal from the first delay group; a first control means for determining an amount of lineal delay in the first delay group; and a second control means for determining an amount of circular delay in the first delay group.

32 Claims, 18 Drawing Sheets

RING-RESISTER CONTROLLED DLL WITH FINE DELAY LINE AND DIRECT SKEW SENSING DETECTOR

CROSS REFERENCE TO RELATED APPLICATION

This application is a continuation application of U.S. application Ser. No. 10/073,358, filed Feb. 13, 2002 now abandoned, the specification and drawings of which are incorporated herein by reference.

FIELD OF THE INVENTION

The present invention related to a delay locked loop (DLL) in a semiconductor memory device; and, more particularly, to a ring-resister controlled DLL with fine delay line and a direct skew sensing detector, which is applicable to circuitry for compensating skew between external and internal clocks.

BACKGROUND OF THE PRIOR ART

Generally, in system circuits of semiconductor devices, a clock signal has been used as a reference signal for adjusting operation timing or guaranteeing high-speed operation without an error. When a clock signal from an external circuit is used in an internal circuit, a time delay (or clock skew) is generated and then a DLL has been used to compensate such a time delay by providing the same phase between the external and internal clock signals. As compared with the phase locked loop (PLL), the DLL has an advantage in that it is less sensitive to a noise than the PLL. Adoringly, the DLL has been widely used in synchronous memories such as DDR SDRAMs (Double Data Rate Synchronous DRAMs) and also a register controlled DLL has been generally used as a DLL circuit.

Referring to FIG. 1, a conventional register controlled DLL includes first and second clock buffers 11 and 12, a clock divider 13, a phase comparator 19, a delay unit 10, which has first to third delay lines 14 to 16, a delay monitor 23 having a shift register 17 and a shift controller 18 in a DLL loop, first and second DLL drivers 20 and 21 and a delay model 22. The first clock buffer 11 receives an inverted external clock signal /clk and produces a first clock signal fall_clk synchronized with a falling edge of the clock signal /clk. Likewise, the second clock buffer 12 receives the external clock signal clk and produces a second clock signal rise_clk synchronized with a rising edge of the clock signal clk. The clock divider 13 divides the second clock signal rise_clk into n (n: a positive integer, typically n=8) signals and then produces a reference signal ref and a delay monitoring signal dly_in. The first delay line 14 receives the first clock signal fall_clk according to an amount of delay from the shift register 17, which is controlled by the shift controller 18, and produces a first internal clock signal ifclk. Also, the second delay line 15 receives the second clock signal rise_clk according to an amount of delay from the shift register 17, which is also controlled by the shift controller 18, and produces a second internal clock signal irclk. The first and second DLL drivers 20 and 21 receive the first and second internal clock signals ifclk and irclk and produce first and second DLL clock signals fclk_dll and rclk_dll, respectively. The third delay line 16 receives the delay monitoring signal dly_in from the clock divider 13 and produces a delayed clock signal feedback_dly. The delay model 22 receiving the delayed clock signal feedback_dly provides the same signal processing path to the delayed clock signal feedback_dly as the actual signal processing path. The phase comparator 19 compares the output from the delay model 22 with the reference signal ref and provides a control signal ctrl to the shift controller 18 according to a phase difference. The shift controller 18 outputs a shift right or left signal SR or SL to the a shift register 17 in response to the control signal ctrl and the first to third delay lines 14 to 16 shift the input clock signals (i.e., fall_clk and rise_clk) based on an amount of shift stored in the shift register 17. Also, the shift controller 18 outputs a DLL locking signal dll_lockb when there is no phase difference between the output from the delay model 22 and the reference signal ref. The delay model 22 includes a dummy clock buffer, a dummy output buffer and a dummy load, which is called a replica circuit. The shift register 17 and the shift controller 18 forms a delay control signal generator 23 to control the first to third delay lines 14 to 16 within a delay unit 10.

The DLL operation in FIG. 1 will be described in detail below. The first clock buffer 11 receiving the external clock signal clk from the external circuit produces the first clock signal fall_clk and the second clock buffer 12 receiving the inverted external clock /clk produces the second clock signal rise_clk. The clock divider 13 produces n clock signals in response to the second clock signal rise_clk, thereby forming the reference clock signal and the delay monitoring signal dly_in which are synchronized with the external clock signal clk every n divided clock signals.

At initial operation, the delay monitoring signal dly_in passes through the third delay line 16 in the delay monitor 10, thereby forming the delayed clock signal feedback_dly, and the delayed clock signal feedback_dly is delayed in the delay model 22 for forming another delayed clock signal (another feedback signal).

The phase comparator 19 compares the rising edge of the reference signal ref with that of the feedback signal and then produces the control signal ctrl. The shift controller 18 produces shift control signals SR and SL, each of which determines the right or left shift in the shift register 17, in response to the control signal ctrl from the phase comparator 19. Also, the shift register 17 determines an amount of the right or left shift of the first to third delay lines in the delay unit 10 in response to the shift control signals SR and SL. Comparing the delayed feedback signal feedback with the reference signal ref on the DLL feedback loop, a delay locking is achieved at the time a minimum jitter is made between them and the delay locking signal dll_lockb is produces as a signal notifying such a locking.

Once the phase locking is achieved, the DLL clock is continuously toggled, except for refresh and power-down modes. Accordingly, this continuous toggling of the DLL clock increases power consumption and, especially, this power consumption is much more at high frequency operation.

As mentioned above, since the conventional register controlled DLL has a time difference between the reference signal ref and the delay monitoring signal dly_in in proportion to a period of the external clock (tCK), a large number of unit delay elements in the delay line are require to compensate such a delay in order that these two signals are in phase. Accordingly, the increase of the unit delay elements causes a wider area of the architecture in the DLL and it takes a longer time to achieve the phase locking. Also, the longer time for phase locking inevitably consumes a large amount of current.

Furthermore, the delay locked loop has to accompany a little jitter. However, in the case where an amount of delay in each unit delay element is not small, the jitter which is caused by the difference between the reference signal ref and the feedback signal may have a large amount.

SUMMARY OF THE INVENTION

It is, therefore, an object of the present invention to provide a delay locked loop for reducing an occupation area thereof and obtaining a desired amount of delay, by implementing a ring-register-control-type delay locked loop.

It is another object of the present invention to provide a delay locked loop for effectively minimizing a jitter by classifying the unit delay elements into two classes, i.e., coarse unit delay elements and fine unit delay elements.

In accordance with an aspect of the present invention, there is provided a ring-register controlled delay locked loop comprising: a first delay group including a plurality of unit delay element which are lineally coupled to each other for delaying an input clock signal; a second delay group including a plurality of unit delay element which are circularly coupled to each other for delaying an output signal from the first delay group; a first control means for determining an amount of lineal delay in the first delay group; and a second control means for determining an amount of circular delay in the first delay group.

In accordance with another aspect of the present invention, there is provided a ring-register controlled delay locked loop comprising: a first delay group including at least one unit delay element; a phase modifying means for modifying a output signals from the a first delay group; a second delay group including a plurality of unit delay element which are circularly coupled to each other for delaying an output signal from the first delay group; a first control means for determining an amount of lineal delay in the first delay group; and a second control means for determining an amount of circular delay in the first delay group.

In accordance with still another aspect of the present invention, there is provided a ring-register controlled delay locked loop comprising: a phase detecting means for comparing an internal clock signal with an output clock signal which is fed back from an output terminal of the ring-register controlled delay locked loop and producing a control signal in order to synchronize the internal clock signal with the output clock signal; a fine delay means for carrying out a fine delay of the internal clock signal in response to the control signal from the phase detecting means or for bypassing the control signal from the phase detecting means; a coarse delay means having a plurality of unit delayers which are coupled each other in a ring type, for coarsely delaying the delayed internal clock signal from the fine delay means in response to the bypassed control signal; an output clock signal generating means for the output clock signal when a desired delay is achieved in the coarse delay means; and a delay model for delaying the output clock signal and transferring the delayed output clock signal to the phase detecting means.

In accordance with still another aspect of the present invention, there is provided a ring-register controlled delay locked loop comprising: a skew detecting means for receiving an internal clock signal and for outputting an internal clock synchronizing signal, which is synchronized with the received internal clock, and a delayed pulse corresponding to an amount of delay in a delay model; a phase detecting means for comparing the internal clock signal with an output clock signal which is fed back from an output terminal of the ring-register controlled delay locked loop and producing a control signal in order to synchronize the internal clock signal with the output clock signal; a fine delay means for carrying out a fine delay of the internal clock signal in response to the control signal from the phase detecting means or for bypassing the control signal from the phase detecting means; a coarse delay means having a plurality of unit delayers which are coupled each other in a ring type, for coarsely delaying the delayed internal clock signal from the fine delay means in response to the internal clock synchronizing signal and the delayed pulse from the skew detecting means and the bypassed control signal from the fine delay means; an output clock signal generating means for the output clock signal when a desired delay is achieved in the coarse delay means; and a delay model for delaying the output clock signal and transferring the delayed output clock signal to the phase detecting means.

In accordance with still another aspect of the present invention, there is provided a ring-register controlled delay locked loop comprising: a skew detecting means for receiving an internal clock signal and for outputting an internal clock synchronizing signal, which is synchronized with the received internal clock, and a delayed pulse corresponding to an amount of delay in a delay model; a phase detecting means for comparing an external clock signal with an output clock signal which is fed back from an output terminal of the ring-register controlled delay locked loop and producing a control signal in order to synchronize the external clock signal with the output clock signal; a fine delay means for carrying out a fine delay of the internal clock signal in response to the control signal from the phase detecting means or for bypassing the control signal from the phase detecting means; a coarse delay means having a plurality of unit delayers which are coupled each other in a ring type, for coarsely delaying the delayed internal clock signal from the fine delay means in response to the internal clock synchronizing signal and the delayed pulse from the skew detecting means and the bypassed control signal from the fine delay means; an output clock signal generating means for the output clock signal when a desired delay is achieved in the coarse delay means; and a delay model for delaying the output clock signal and transferring the delayed output clock signal to the phase detecting means.

In accordance with still another aspect of the present invention, there is provided a ring-register controlled delay locked loop comprising: a skew detecting means for receiving an internal clock signal and for outputting an clock synchronizing signal, which is synchronized with the received internal clock, and a delayed pulse corresponding to an amount of delay in a delay model; a phase detecting means for comparing an external clock signal with an output clock signal which is fed back from an output terminal of the ring-register controlled delay locked loop and producing a first control signal in order to synchronize the external clock signal with the output clock signal; a coarse delay means having a plurality of unit delayers which are coupled each other in a ring type, for coarsely delaying the delayed internal clock signal from the fine delay means in response to the clock synchronizing signal and the delayed pulse from the skew detecting means and a second control signal; an output clock signal generating means for generating the output clock signal while the coarse delay is required in the coarse delay means; a fine delay means for carrying out a fine delay of the internal clock signal in response to the first control signal from the phase detecting means or for bypassing the first control signal from the phase detecting means and then producing the second control signal; and a delay model for delaying the output clock signal and transferring the delayed output clock signal to the phase detecting means.

In accordance with still another aspect of the present invention, there is provided a ring-register controlled delay locked loop comprising: a skew detecting means for receiving an internal clock signal and for outputting an clock synchronizing signal, which is synchronized with the received internal clock, and a delayed pulse corresponding to an amount of delay in a delay model; a phase detecting means for comparing the internal clock signal with an output clock signal which is fed back from an output terminal of the ring-register controlled delay locked loop and producing a first control signal in order to synchronize the internal clock signal with the output clock signal; a coarse delay means having a plurality of unit delayers which are coupled each other in a ring type, for coarsely delaying the delayed internal clock signal from the fine delay means in response to the clock synchronizing signal and the delayed pulse from the skew detecting means and a second control signal; an output clock signal generating means for generating the output clock signal while the coarse delay is required in the coarse delay means; a fine delay means for carrying out a fine delay of the internal clock signal in response to the first control signal from the phase detecting means or for bypassing the first control signal from the phase detecting means and then producing the second control signal; and a delay model for delaying the output clock signal and transferring the delayed output clock signal to the phase detecting means.

In accordance with still another aspect of the present invention, there is provided a method for generating a delay locking clock signal in a register controlled register controlled delay locked loop, the method comprising the steps: delaying an input lock signal in a first delay group including a plurality of unit delay elements, which are lineally coupled to each other for delaying the input clock signal, in response to a first control signal determining an amount of lineal delay; and circulating and delaying an output signal from the first delay group in a second delay group including a plurality of unit delay elements, which are circularly coupled to each other, in response to a second control signal determining an amount of circular delay.

DETAILED DESCRIPTION OF THE PREFERRED EMOBIDMENTS OF THE INVENTION

Hereinafter, a high performance ring-resister controlled DLL with fine and coarse delay units will be described in detail in reference to the accompanying drawings.

Figure 1:
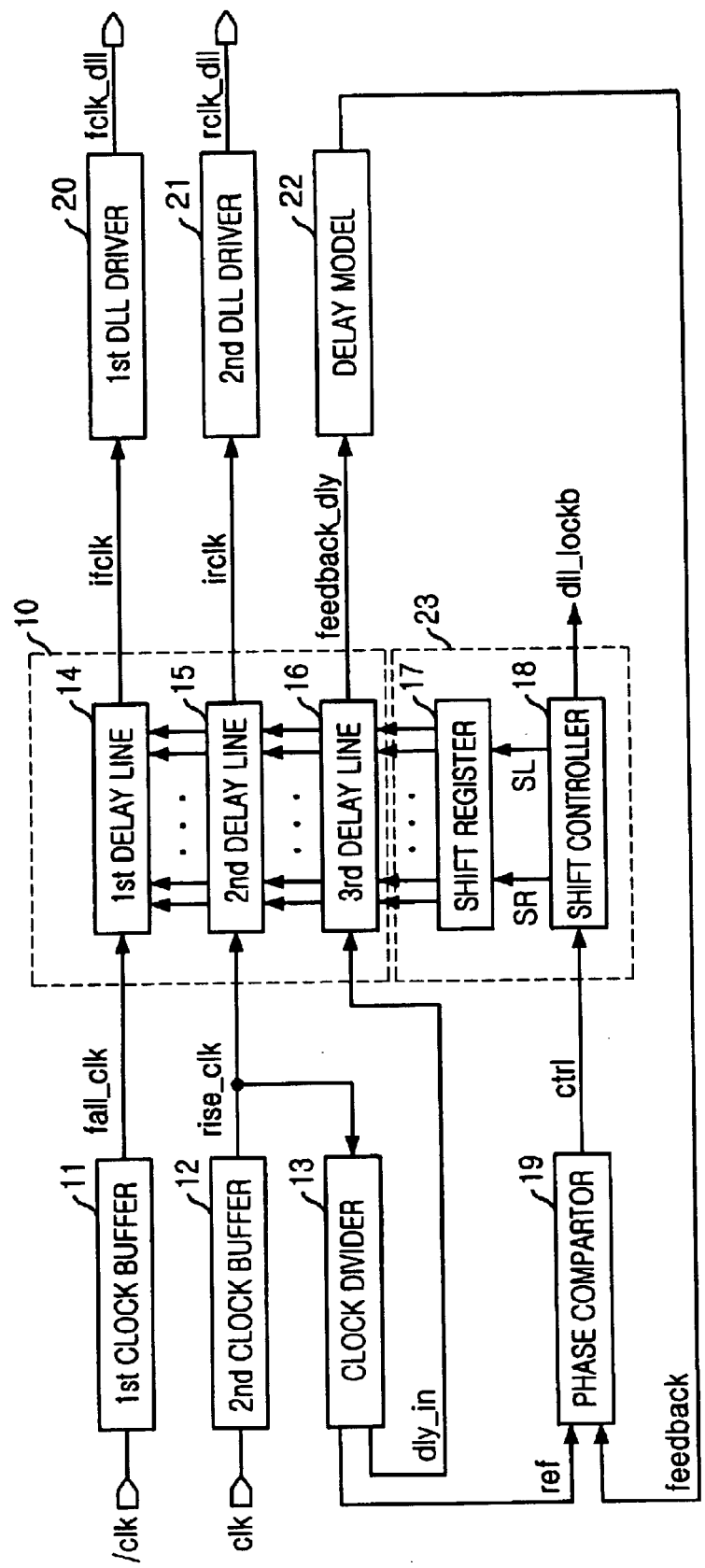
FIG. 1 is a block diagram illustrating a register controlled DLL of a conventional DDR SDRAM.
Figure 2:
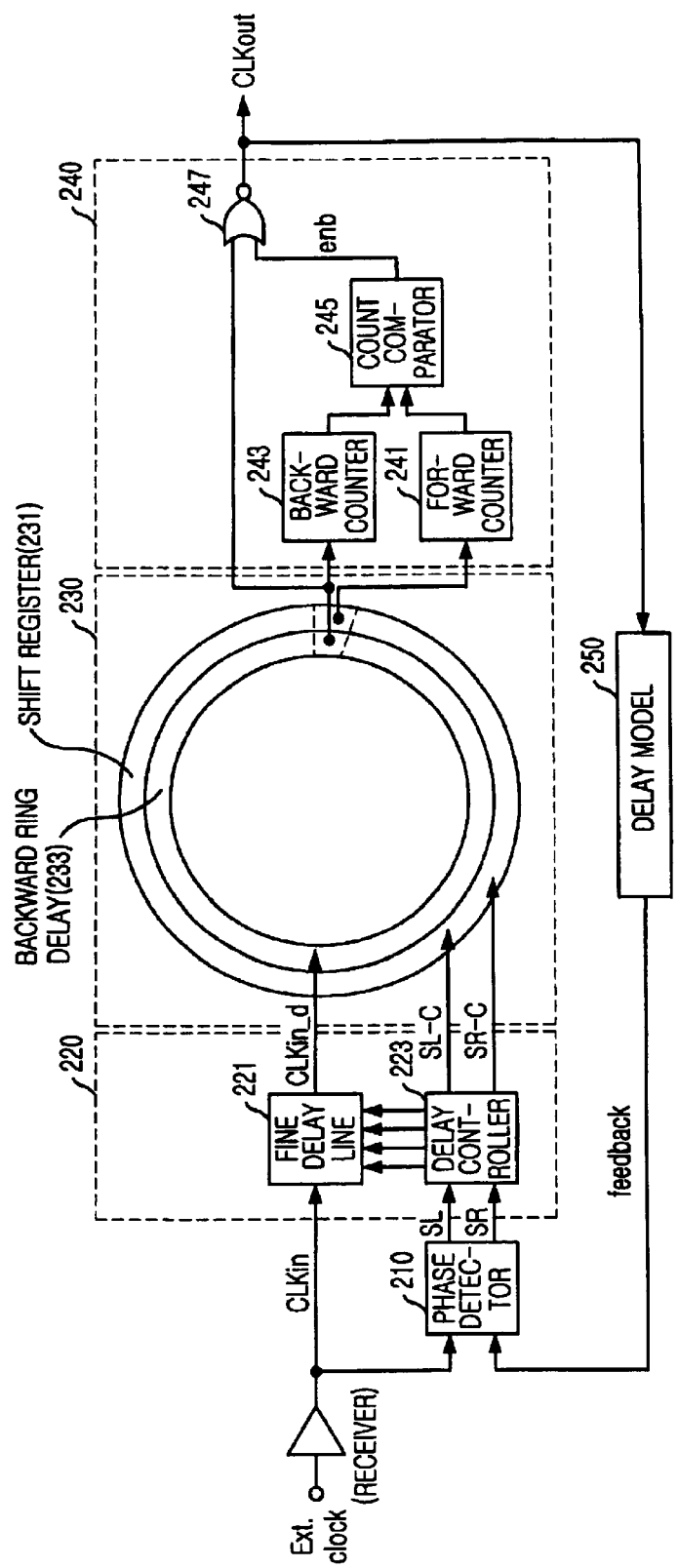
FIG. 2 is a block diagram illustrating a ring-register controlled delay locked loop in accordance with a first embodiment of the present invention.

Referring to FIG. 2, the ring-register controlled DLL according to a first embodiment of the present invention includes: a phase detector 210 to detect a phase difference between an internal clock signal CLKin and a feedback signal, which is produced by delaying an output clock signal CLKout through a delay model and feeding back the delayed output clock signal CLKout, and to output a shift left signal SL and a shift right signal SR; a fine delay unit 220 to delicately delay the internal clock signal CLKin in response to the shift left and right signals SL and SR or to by-pas the shift left and right signals SL and SR; a coarse delay unit 230 having a plurality of unit delayers in a ring type to delay an output from the fine delay unit 220 in response to the shift left and right signals SL and SR; an output unit 240 to generate the output clock signal CLKout when a desired delay is achieved; and a delay model 250 to delay the output clock signal CLKout by a delay time (tDM) through a feedback loop.

If the delay locking is well done, a phase of the reference signal (CLKin in the present invention) from the phase detector 210 lags behind that of the output clock signal CLKout by the delay time (tDM) of the delay model 250 Accordingly, a design for the amount of the delay in the delay model 250, i.e., tDM, can determine the phase of the output clock signal CLKout and also it is the same when tDM is of "0."

Figure 3A:
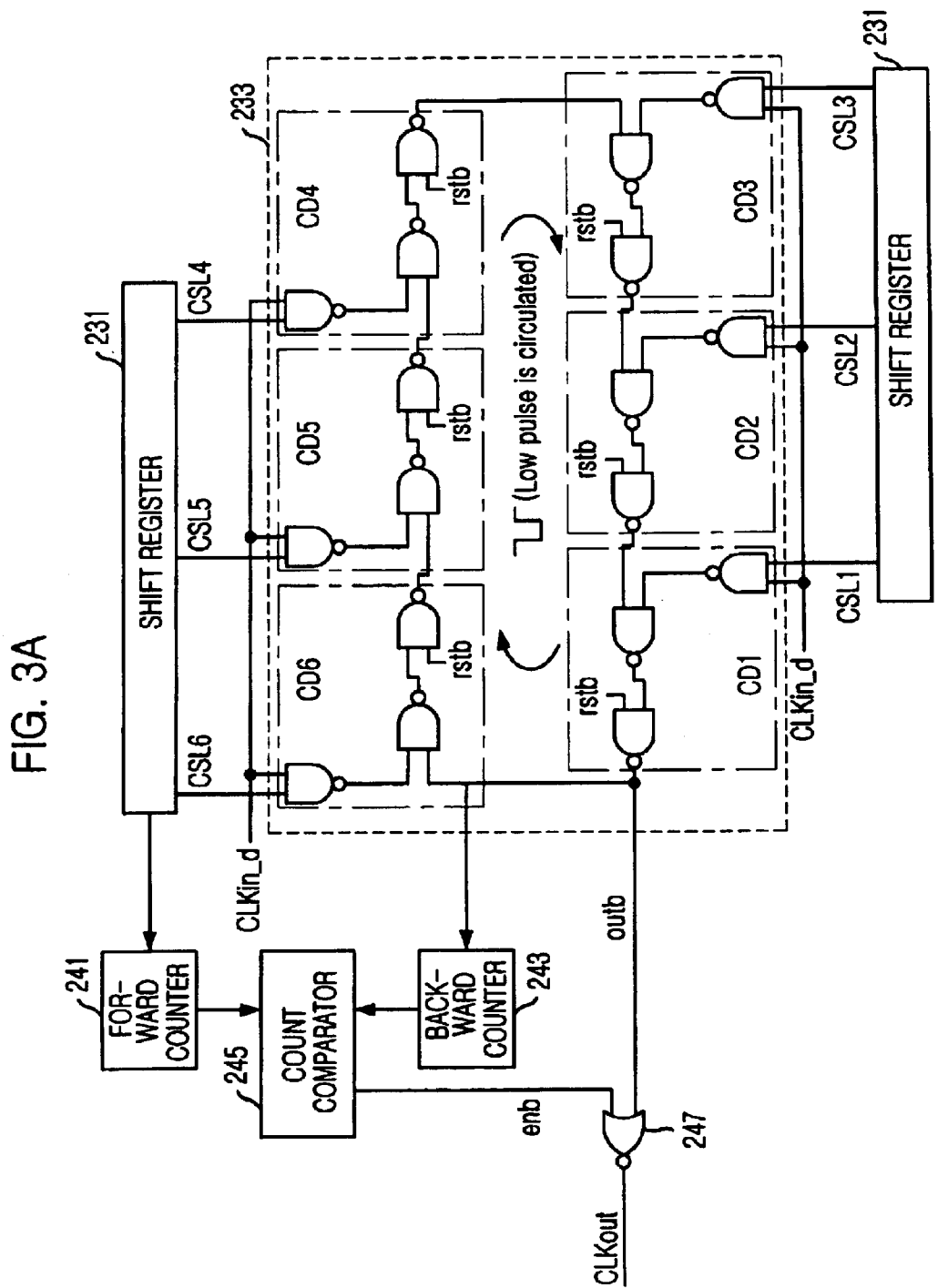
FIG. 3A is a detailed block diagram illustrating a coarse delay unit and an output clock signal generator in accordance with the first embodiment of the present invention.
Figure 3B:
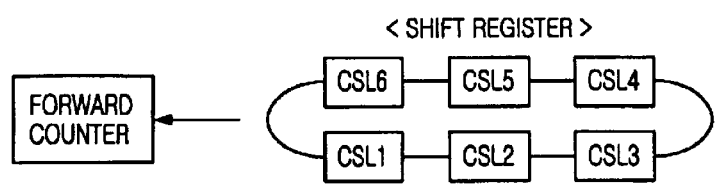
FIGS. 3B and 3C are block diagrams illustrating a shift register and a forward counter in accordance with the first embodiment of the present invention.
Figure 3C:
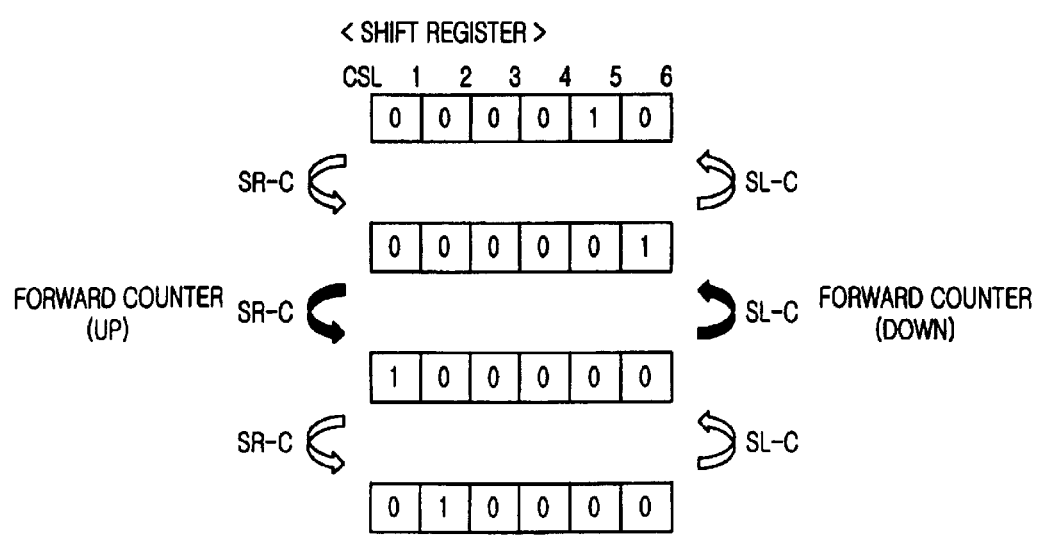
Figure 4:
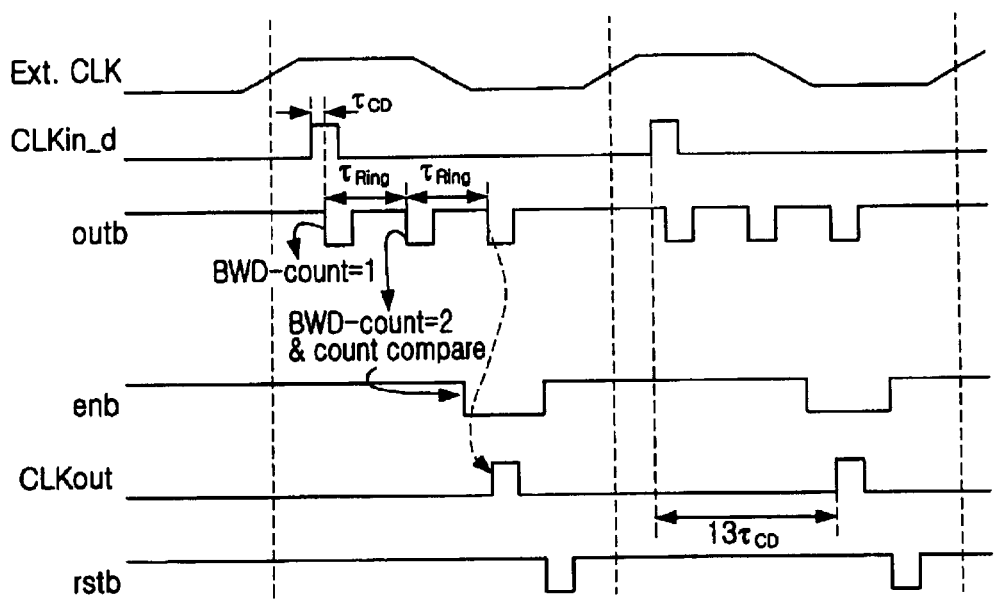
FIG. 4 is a timing chart of the coarse delay unit and the output clock signal generator in FIG. 3A.
Figure 5A:
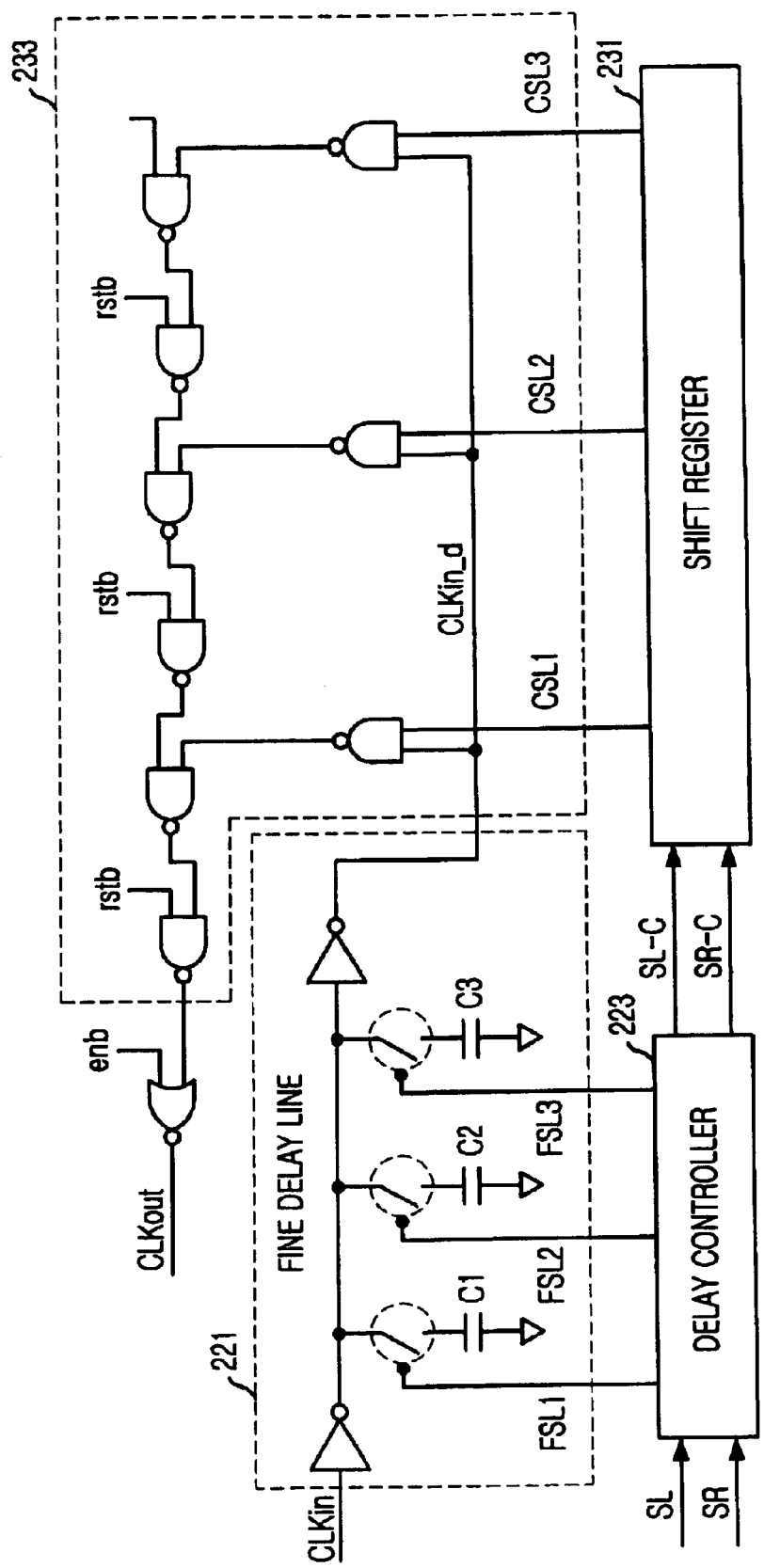
FIG. 5A is a block diagram illustrating operations of a fine delay unit and a portion of the coarse delay unit in accordance with the first embodiment of the present invention.
Figure 5B:
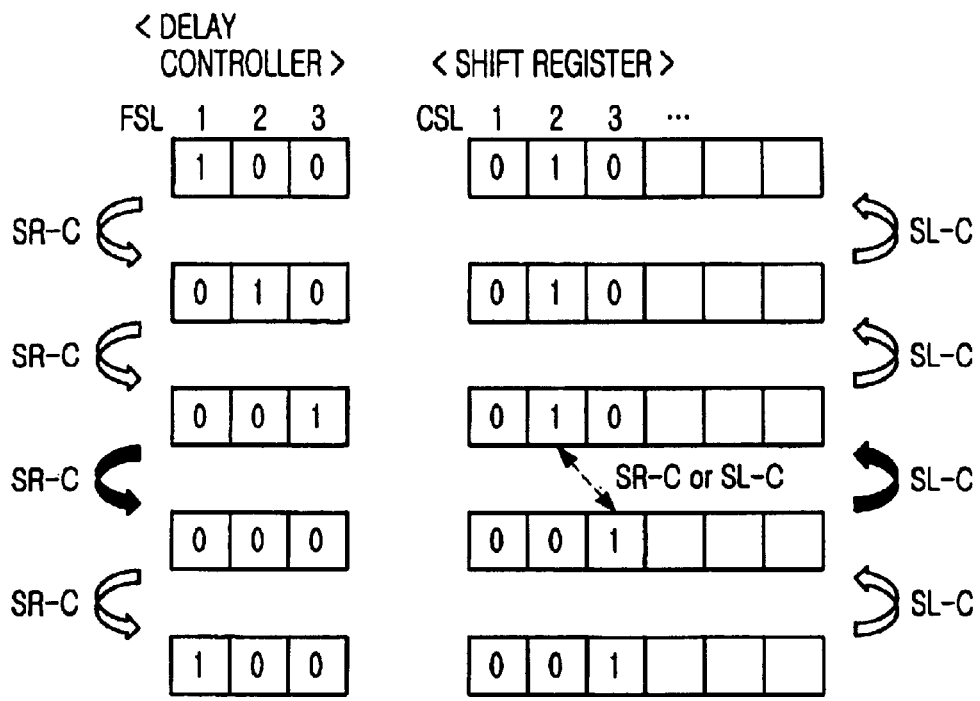
FIG. 5B is a block diagram illustrating operations of a delay controller and the shift register in accordance with the first embodiment of the present invention.
Figure 5C:
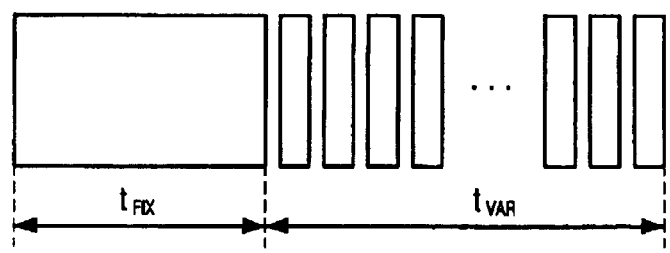
FIG. 5C is a block diagram illustrating a time delay in the fine delay unit in accordance with the first embodiment of the present invention.

Detailed operations of the coarse delay unit 230 and an portion of the output unit 240 are shown in FIGS. 3A to 3C and 4 and the fine delay unit 220 is shown in in FIGS. 5A to 5C. The unit delay time in the coarse delay unit 230 is generally longer than that in fine delay unit 220.

First, referring to FIG. 3A, the coarse delay unit 230 includes: a shift register 231 having a plurality of multistage logic circuits to output only one signal of a high voltage level in response to the by-passed shift left or right signal SL or SR from the fine delay unit 220; and a backward ring delay 233 having six stages CD1 to CD6 in a type of ring, each of which includes an NAND gate unit element, in order to output the delayed internal clock signal outb in response to an output signal from the shift register 231.

The backward ring delay 233 is composed of a plurality of NAND gates with a symmetric structure so that a constant delay time is obtained regardless of high-to-high and low-to-low signal transmission. Accordingly, the pulse width circulated in the ring of the backward ring delay 233 may not be changed even if a specific design and element therefore is not provided thereto. Furthermore, the shift register 231 has a plurality of logic circuits which are connected each other in a type of ring and provides the number of pulse circulation to a forward counter 241.

The delayed internal clock signal CLKin_d is inputted into one of the six stages of the backward ring delay 233 in response to one of delay selection signals CSL1 to CSL6 (output signals from logic circuits in a shift register) from the shift register 231. When one of the delay selection signals CSL1 to CSL6 is in a high voltage level and other signals are in a low voltage level, the delayed internal clock signal CLKin_d inputted into the stage, which receives the delay selection signal of a high voltage level, is out of phase. For example, if one of the delay selection signals CSL1 to CSL6 from the shift register 231, the delay selection signal CSL2, is in a high voltage level, the delayed internal clock signal CLKin_d is inputted into the second stage CD2 and an output from the second stage CD2 is transferred to the first stage CD1. This continuous pulse circulation in the backward ring delay 233 is achieved by a pulse circulation in a low voltage level. The output clock signal CLKout is outputted when an enable signal enb from a counter comparator 245 is activated in a low voltage level. A reset signal rstb in a low voltage level is inputted into each of the stages CD1 to CD6 in response to the enable signal from a counter comparator 245.

The reset signal rstb goes from a low voltage level to a high voltage level immediately after the enable signal enb from a counter comparator 245 goes from a low voltage level to a high voltage level, thereby resetting the backward ring delay 233. In the case where the shift register 231 is initialized, the delay selection signal CSL1 is in a high voltage level and other ones CSL2 to CSL6 are in a low voltage level.

On the other hand, the forward counting based on the operation of the shift register 231 will be described in FIGS. 3B and C Referring now to FIG. 3B, the shift register 231 has a plurality of registers which are circularly connected to each other in a ring type and which respectively produce the delay selection signals CSL1 to CSL6.

Referring to FIG. 3C, one of the delay selection signals CSL1 to CSL6 is in a high voltage level and then this high level pulse is shifted left or right in the shift register 231 in response to a coarse shift left or right signal SL_C or SR_C. Since the shift register 231 is in a ring type, the high level pulse is counterclockwise circulated in the shift register 231 in response to the continuous coarse shift right signal SR_C. On the contrary, the coarse shift left signal SL_C is continuously issued, the high level pulse is clockwise circulated in the shift register 231.

The forward counter 241 counts the number of circulation of the high level pulse, which is created by one input of the delay selection signals CSL1 to CSL6. That is, whenever the shift right signal SR_C is continuously produced and then the high voltage signal is transferred from the sixth stage CD6 to the first stage CD1, the forward counter 241 increases the count value one-by-one. On the contrary, whenever the shift left signal SL_C is continuously produced and then the high voltage signal is transferred from the first stage CD1 to the sixth stage CD6, the forward counter 241 decreases the count value one-by-one. In such a manner, the value counted by the forward counter 241 indicates that how much the delayed internal clock signal CLKin_d inputted into the backward ring delay 233 is circulated therein. The forward count-up or-down is executed by a shift between the delay selection signals CSL1 and CSL6, as indicated by dark arrows in FIG. 3C.

The backward counter 243 counts the number of circulation of the delayed internal clock signal CLKin_d within the backward ring delay 233, by monitoring an output from the first stage CD1. The counter comparator 245 compares the counted values from the backward counter 243 and the forward counter 241. If the counted values agree with each other, the enable signal enb goes from a high voltage level to a low voltage level and then an output signal outb from the first stage CD1 is outputted, as an output clock signal CLKout, via a NOR gate 247.

FIG. 4 is a timing chart of the coarse delay unit and the output clock signal generator in the case where the value counted in the forward counter 241 is "2" and the delay selection signal CSL1 is in a high voltage level. Also, FIG. 4 is a plot taken when the delayed internal clock signal CLKin_d is circulated twice at the start from the first stage CD1 in the backward ring delay 233. That is, this circulation means that the delayed internal clock signal CLKin_d pases through thirteen unit delays (delay time=$13\tau_{CD}$), where $\tau_{CD}$ is a unit delay time within one stage in the backward ring delay 233 and $\tau_{RING}$ is a delay time for one circulation in the backward ring delay 233. In this embodiment of the present invention, since the backward ring delay 233 has the six stages, each of which is composed of a unit delay element, $\tau_{RING}$ is the same as $6\tau_{CD}$.

In the shift register 231, if the delay selection signal CSL1 is in a high voltage level and the delayed internal clock signal CLKin_d inputted into the first stage CD1, which is also in a high voltage level, the low pulse is circulated in the backward ring delay 233. After a lapse of $\tau_{CD}$ taken by the first stage CD1, the output signal outb (the circulating low voltage level signal) from the first stage CD1 is inputted into both the sixth stage CD6 and the backward counter 243 so that the backward counter 243 increases the count value in response to the output signal outb from the first stage CD1.

Since the low voltage level signal is clockwise circulated in the backward ring delay 233, the next output from the first stage CD1 increases the count value in the backward counter 243. The number of circulation of the low voltage level signals is counted in the backward counter 243. In the case where the number of circulation is two, the count value in backward counter 243 is the same as that in the forward counter 241 and then the counter comparator 245 produces the enable signal enb of a low voltage level. The enable signal enb controls the NOR gate 247 to pass the next circulating output signal outb (third pulse of the output signal outb in FIG. 4) from the first stage CD1. The rest signal rstb is issued and rests the backward counter 243, the counter comparator 245 and the backward ring delay 233 at the time the output signal outb goes from a low voltage level to a high voltage level.

As a result, since the output clock signal CLKout is produced after the delayed internal clock signal CLKin_d is inputted into the first stage and it is circulated twice in the backward ring delay 233, the total amount of delay is $13\tau_{CD}$ as mentioned above. This amount of delay is controlled by the delay selection signals CSL1 and CSL6, which are determined by an amount of phase difference detected in the phase detector 210. For example, if the delay selection signal CSL2 is in a high voltage level and the delayed internal clock signal CLKin_d is inputted into the second stage CD2 in FIG. 3A, the total amount of delay may be $14\tau_{CD}$.

As described above, since the desired amount of delay time can be obtained by increasing the number of circulation of the delayed internal clock signal CLKin_d in the backward ring delay 233, the DLL according to the present invention needs just a small number of multistage delayers and the counters even though it needs very long delay time. Accordingly, the present invention can reduc the occupation area of a semiconductor chip.

When the DLL according to the present invention is initialized, a delay controller 223 in the fine delay unit 220 bypasses the output signal from the phase detector 210 to carry out the coarse delay. After such a coarse delay has been completed, the fine delay is carried out by using the output clock signal CLKout.

FIG. 5A is a block diagram illustrating operations of the fine delay unit 220 including three unit delay elements and a portion of the coarse delay unit 230 in accordance with the first embodiment of the present invention, FIG. 5B is a block diagram illustrating operations of the delay controller 223 and the shift register 231 in accordance with the first embodiment of the present invention, and FIG. 5C is a block diagram illustrating a time delay in the fine delay unit 220 in accordance with the first embodiment of the present invention;

The delay controller 223 produces three kinds of control signals, fine delay selection signals FSL1 to FSL3 (output signals from logic circuits in a shift register), each of which controls switching operation for providing a capacitive load to the delayed internal clock signal CLKin for time delay thereof. When all the fine delay selection signals FSL1 to FSL3 are in a high voltage level, switches SW1 to SW3 connect all the capacitors C1 to C3 to the signal line of the delayed internal clock signal CLKin so that the delayed internal clock signal CLKin is delayed by the connected capacitors. When all the fine delay selection signals FSL1 to FSL3 are in a low voltage level, the capacitors are not connected to the signal line of the delayed internal clock signal CLKin and then there is no delay caused by the capacitors. In the case where the there is no delay caused by the capacitors, the delayed internal clock signal CLKin is delayed only in the coarse delay unit 230 without any delay in the fine delay unit 220

If the fine delay selection signals FSL1 is in a high voltage level, the load of the capacitance C1 is applied to the delayed internal clock signal CLKin and an amount of the delay is increased by the capacitive load. At this time, the increased delay is "$\tau_{FD}$" (the uppermost stage in FIG. 5B).

In the case where the delay selection signal CSL2 of the shift register 231 is in a high voltage level and the shift right signal SR is issued from the phase detector 210, the high voltage level of the fine delay selection signals FSL1 is right shifted to make the fine delay selection signals FSL2 of the high voltage level. At this time, the delay selection signals CSL1 to CSL6 in the coarse delay unit 230 are not affected by the fine delay unit 220. Since the capacitive load C2 is applied to the delayed internal clock signal CLKin, the total amount of the delay is "$2\tau_{FD}$" (the second stage in FIG. 5B).

Likewise, if the shift right signal SR is issued again from the phase detector 210, the high voltage level of the fine delay selection signals FSL2 is right shifted to make the fine delay selection signal FSL3 of the high voltage level and the capacitive load C3 is applied to the delayed internal clock signal CLKin. Accordingly, the total amount of the delay is "$3\tau FD$" (the third stage in FIG. 5B). When the shift right signal SR is issued again from the phase detector 210, all the fine delay selection signals FSL3 are in a low voltage level because there is no logic circuit to which the fine delay selection signals FSL3 transits. At this time, the high voltage level of the delay selection signals CSL2 is shifted to make the delay selection signal CSL3 of the high voltage level in the shift register 231 and this is executed when the delay controller 223 bypasses the shift right signal SR from the phase detector 210 to the shift register 231 (the fourth stage in FIG. 5B). If the unit delay ($\tau_{CD}$) in the backward ring delay 233 is set to $4\tau_{FD}$ (i.e., $\tau_{CD}=4\tau_{FD}$), the amount of delay more than $4\tau_{FD}$ may be obtained on a fine delay unit basis within the coarse delay unit 230.

In the case where all the fine delay selection signals FSL1 to FSL3 1 are in a low voltage level, the delay selection signal CSL3 is in a high voltage level (the fourth stage in FIG. 5B), and then the shift left signal SL is inputted from the phase detector 210, the delay controller 223 makes the high voltage level of the delay selection signal CSL3 transited to the delay selection signal CSL2 and makes the fine delay selection signal FSL3 high because there is no logic circuit to decrease the delay time. As a result, since one unit delay ($\tau_{CD}=4\tau_{FD}$) in the backward ring delay 233 is decreased and three unit delay $3\tau$ FD in the fine delay unit 220 are achieved, the decreased amount of delay is "$\tau_{FD}$" (the third stage in FIG. 5B). If the shift left signal SL is issued again from the phase detector 210, the delayed internal clock signal CLKin is delayed only in the fine delay unit 220 without any delay in the coarse delay unit 230 so that the high voltage level of the fine delay selection signals FSL3 is left shifted to the fine delay selection signals FSL2 with the decreased delay of $\tau_{FD}$ (the fourth stage in FIG. 5B).

As stated above, the amount of delay can be controlled on a fine delay unit basis by correlating the coarse delay unit 230 with the fine delay unit 220 so that the jitter is deduced by $1\tau$ FD. Also, the less is the unit delay time in the fine delay unit 220, the smaller the jitter is.

Referring to FIG. 5C, the total delay time in a fine delayer 221 of the fine delay unit 220 is the sum of a fixed delay time ($\tau_{FIX}$) and a variable delay time ($\tau_{VAR}$), where the fixed delay time is a specific value which is generated by two inverters in the first embodiment of the present invention. The delay model 250 may compensate two inverters for such a fixed delay time.

On the other hand, the coarse unit delay time $\tau_{CD}$ and a maximum fine delay time $\tau_{VAR,\ max}$ may be given by:

$$|\tau_{CD}-\tau_{VAR,max}|\leq\tau_{FD} \tag{1}$$

Also, the variable delay time satisfies the following equation:

$$\tau_{VAR}=m\times\tau_{FD} \tag{2}$$

where m is the number of stage of the fine delay line. If $0\leq m\leq N$, $\tau_{VAR,max}=N\times\tau_{FD}$. If the equation (2) is not satisfied in the DLL design of the present invention, the total jitter is not the fine unit delay time $\tau_{FD}$, but is determined by $|\tau_{CD}-\tau_{VAR,max}|$. In other words, the total jitter is determined by the bigger one of the fine delay time $\tau_{FD}$ and $|\tau_{CD}-\tau_{VAR,max}|$.

Figure 6:
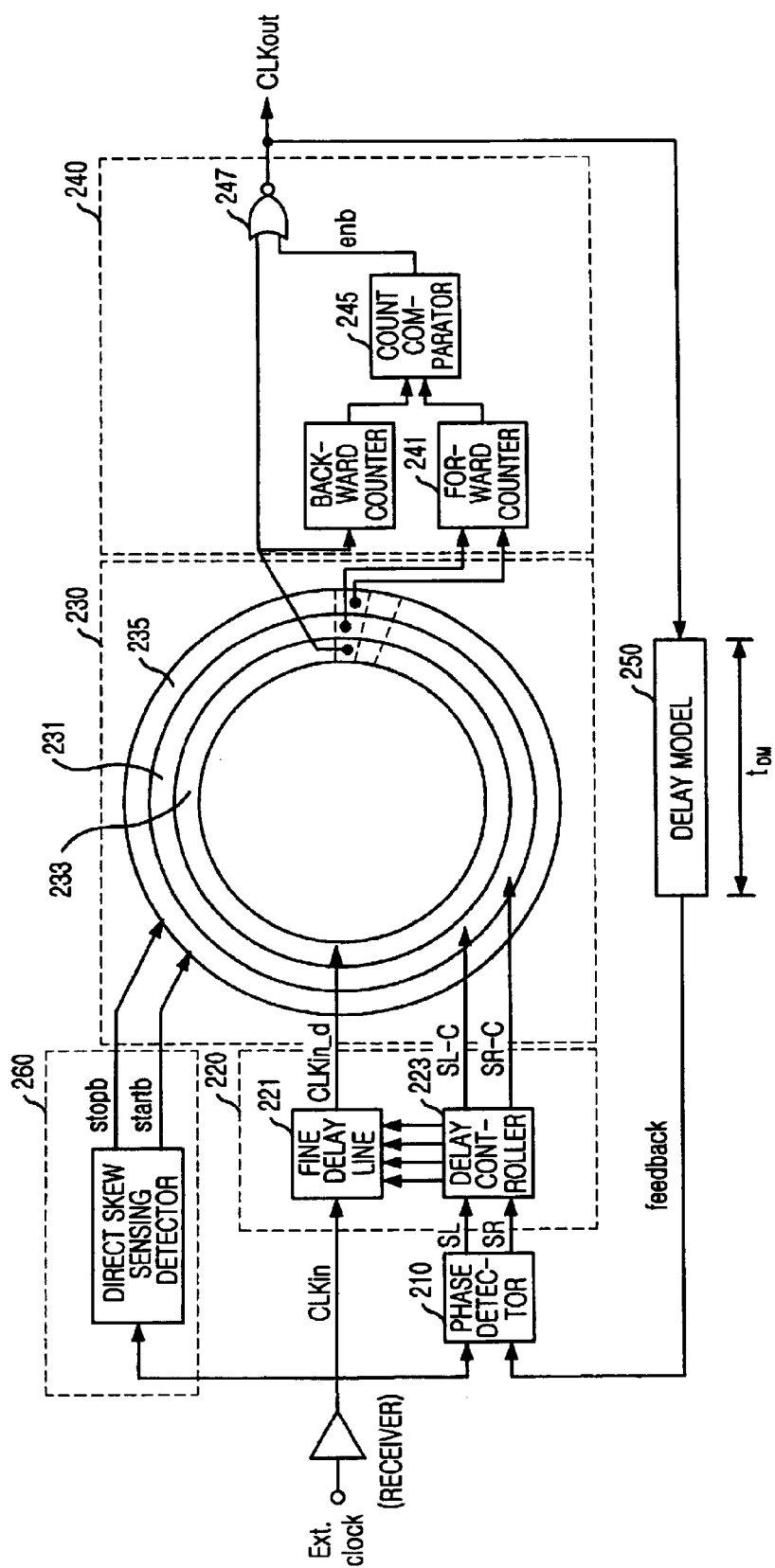
FIG. 6 is a block diagram illustrating a ring-register controlled delay locked loop in accordance with a second embodiment of the present invention.

FIG. 6 is a block diagram illustrating a ring-register controlled delay locked loop in accordance with a second embodiment of the present invention. In the second embodiment of the present invention, a direct skew sensing detector 260 and a forward ring delay 235 is further shown.

The direct skew sensing detector 260 may provide the locking within two cycles, by using the synchronous mirror delay technique (hereinafter, referred to as SMD). The SMD has two mirror delay lines and needs a register array to control these mirror delay lines. One of the two mirror delay lines is called "forward delay line" and the other is called "backward delay line." Since the register controlled DLL typically has one delay line and a shift register to control the delay line, the SMD can be adapted to the register controlled DLL by simply adding the forward delay line to its configuration.

The second embodiments of the ring-register controlled DLL according tot the present invention directly detects the skew by adding the forward ring delay 235 to the first embodiments having the backward ring delay 233 and the shift register 231.

Figure 7A:
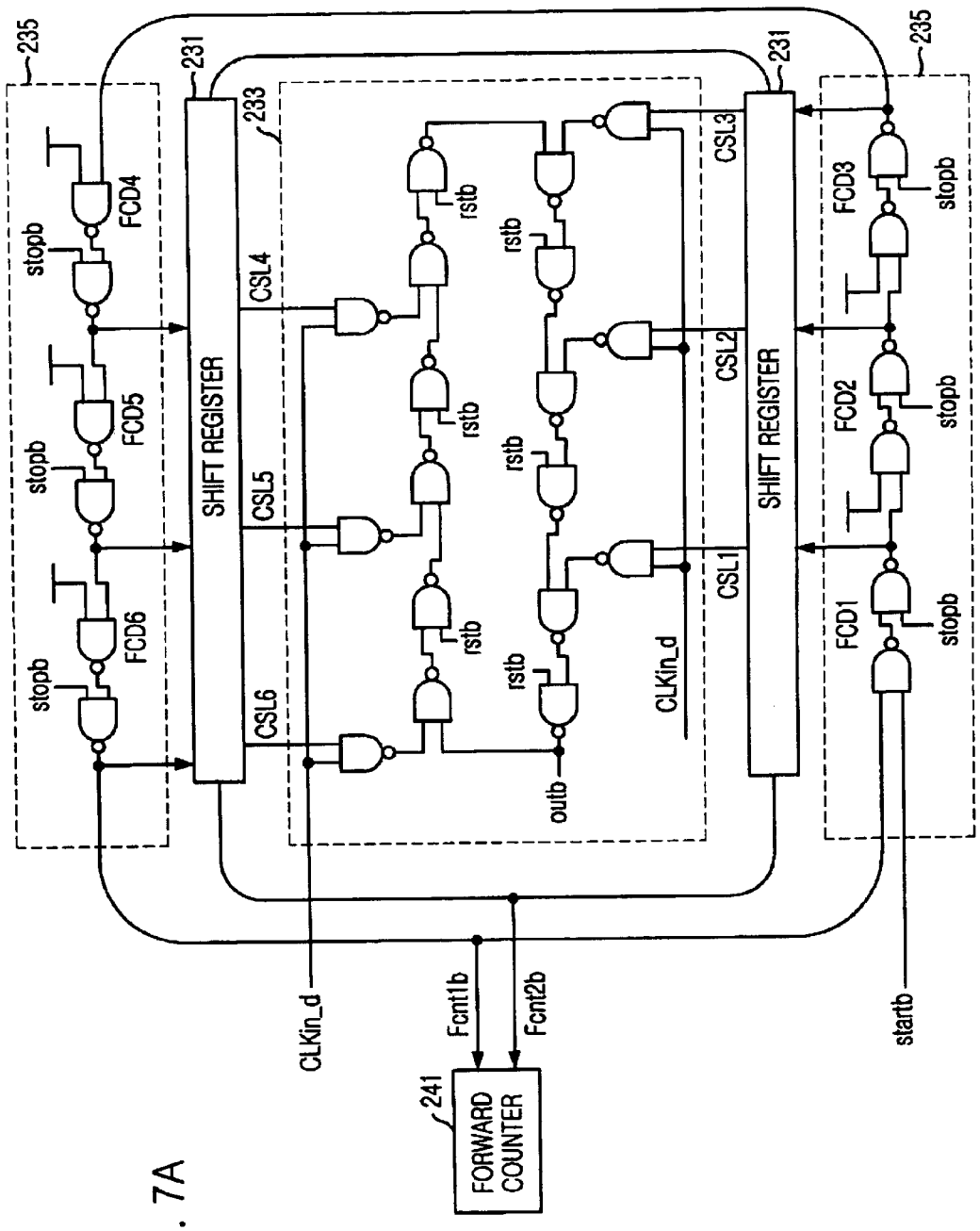
FIG. 7A is a detailed block diagram illustrating the coarse delay unit and an output clock signal generator in accordance with the second embodiment of the present invention.
Figure 7B:
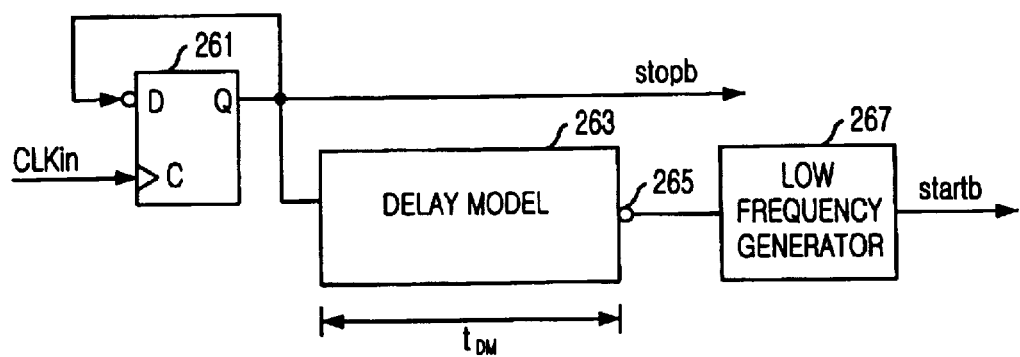
FIG. 7B is a detailed block diagram illustrating a direct skew sensing detector in accordance with the second embodiment of the present invention.
Figure 7C:
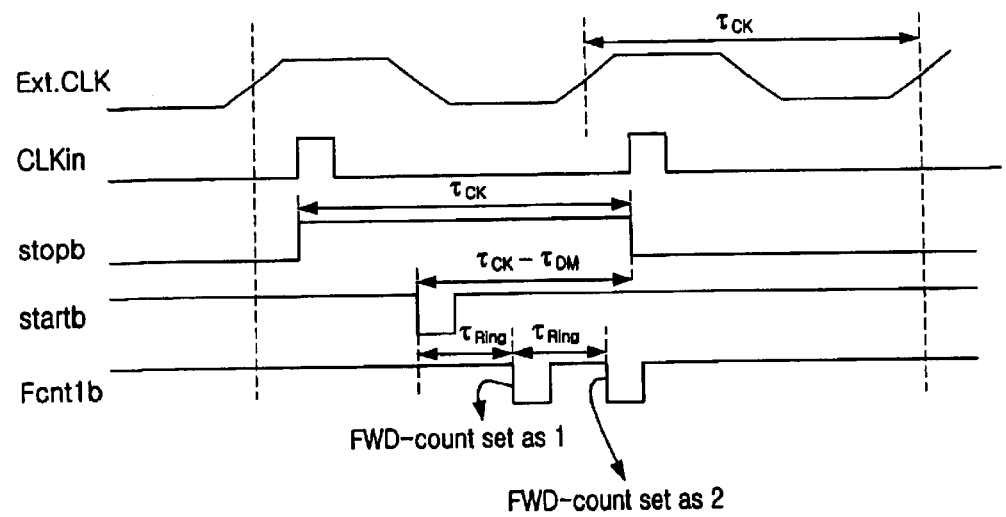
FIG. 7C is a timing chart illustrating operations of a forward ring delay and a forward counter in accordance with the second embodiment of the present invention.

FIG. 7A is a detailed block diagram illustrating the coarse delay unit and the output clock signal generator in accordance with the second embodiment of the present invention; FIG. 7B is a detailed block diagram illustrating a direct skew sensing detector in accordance with the second embodiment of the present invention; and FIG. 7C is a timing chart illustrating operations of the forward ring delay and the forward counter in accordance with the second embodiment of the present invention.

Referring to FIG. 7B, when the initial internal clock signal CLKin is inputted to the carry C of a D flip-flop 261, a stop signal stopb (low active) is in a high voltage level, a start signal startb is generated by delaying the stop signal stopb by the delay time $t_{DM}$ in a delay model 263, inverting the delayed stop signal in an inverter 265 and having it passing through a low frequency generator 267. In other words, the start signal startb maintains a low voltage level for a while and then becomes the high voltage level. Here, the delay time $t_{DM}$ of the delay model 263 is the same as that $t_{DM}$ of the delay model 250.

Referring to FIG. 7A, if the start signal startb is entered into a first stage FCD1 in the forward ring delay 235 and circulated, until a next delayed internal clock signal CLKin is inputted and the stop signal stopb is changed into the low voltage level, the forward counter 241 counts the number of circulation in response to a forward ring delay output signal Fcnt1b and the shift register 231 stores the number of stage FCD to which the low voltage level signal L is finally transferred. It is recorded that the delay time $t_{DM}$ in the delay model 263 corresponds to how many circulation and which stage FCD in the forward ring delay 235. In FIG. 7C, the forward ring delay is circulated two times.

If it is known that the time difference $t_{CK}-t_{DM}$ corresponds to which number of the circulation and the forward coarse delay FCD in the forward ring delay 235, the coarse delay is performed through the backward ring delay 233 based on the number of circulation and the forward coarse delay, and then the fine delay is carried out. Since operations in the coarse delay of the backward ring delay 233 and the fine delay of the fine delay unit are the same as those in the first embodiment, for easy description, detailed description about the coarse delay and the fine delay will be skipped in this embodiment.

In most cases, the coarse delay performed by the forward ring delay is performed only one time, the fine delay is carried out a predetermined number of times based on relation between the coarse delay of the forward ring delay and the fine delay of the fine delay unit. However, the coarse delay may be carried out two or more times.

Figure 8:
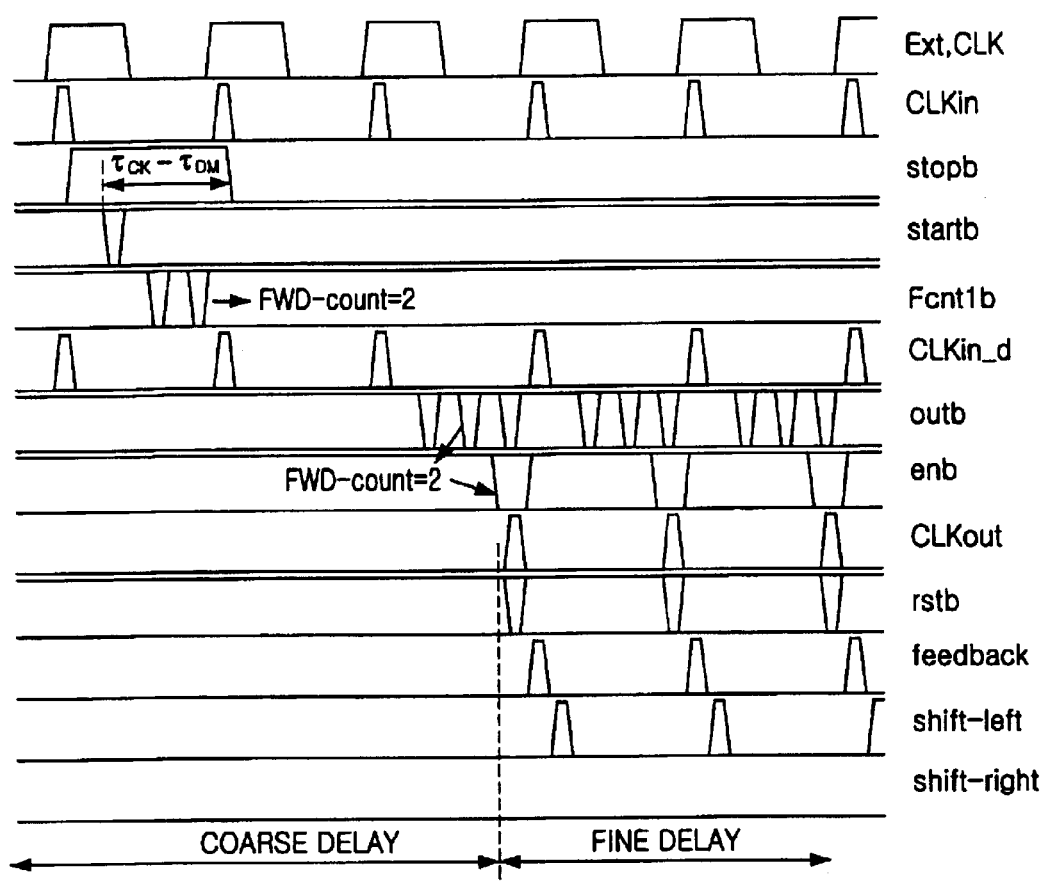
FIG. 8 is a timing chart of the coarse delay unit and the output clock signal generator in FIG. 7A.

FIG. 8 is a timing chart of the coarse delay unit and the output clock signal generator in FIG. 7A.

The direct skew detection is performed by the forward ring delay, the delay locking of the coarse delay is performed by the backward ring delay, and then the delay locking of the fine delay is performed by the fine delay unit.

Figure 9:
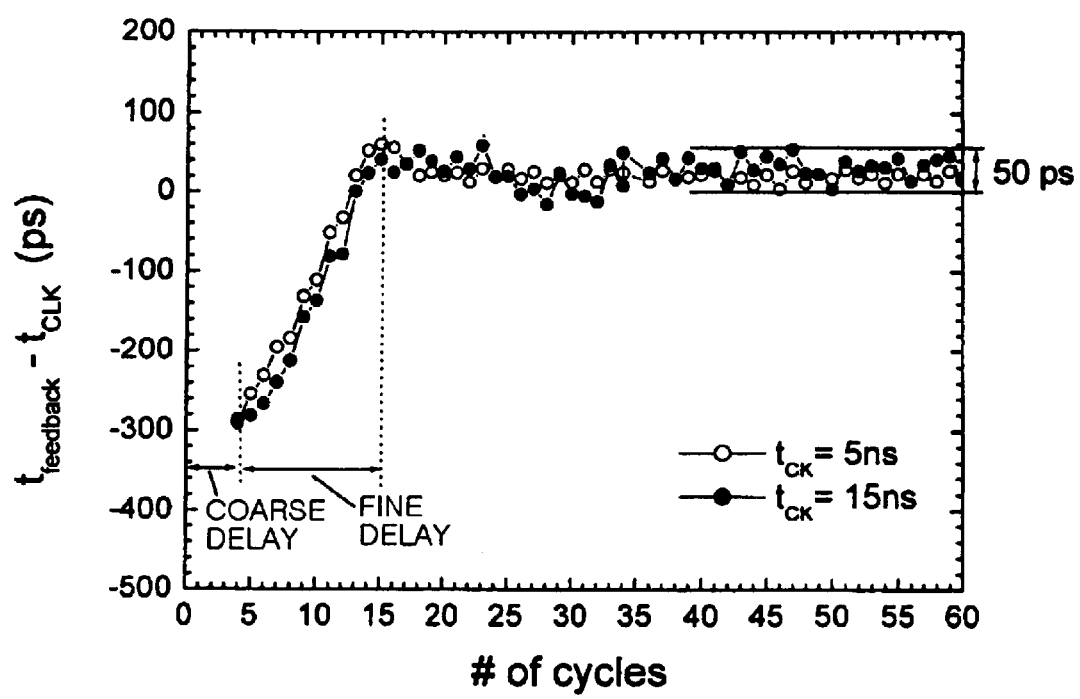
FIG. 9 is a plot showing a relationship between a delay locking time and a jitter in accordance with the second embodiment of the present invention.

FIG. 9 is a plot showing a relationship between a delay locking time and a jitter in accordance with the second embodiment of the present invention.

Referring to FIG. 9, the delay locking time for two frequencies is only 15 cycles. If the fine unit delay time $\tau_{FD}$ decreases, the total delay locking time increase, however, the delay locking by the coarse delay does not vary. In this simulation, the total jitter is about 50 psec.

Figure 10:
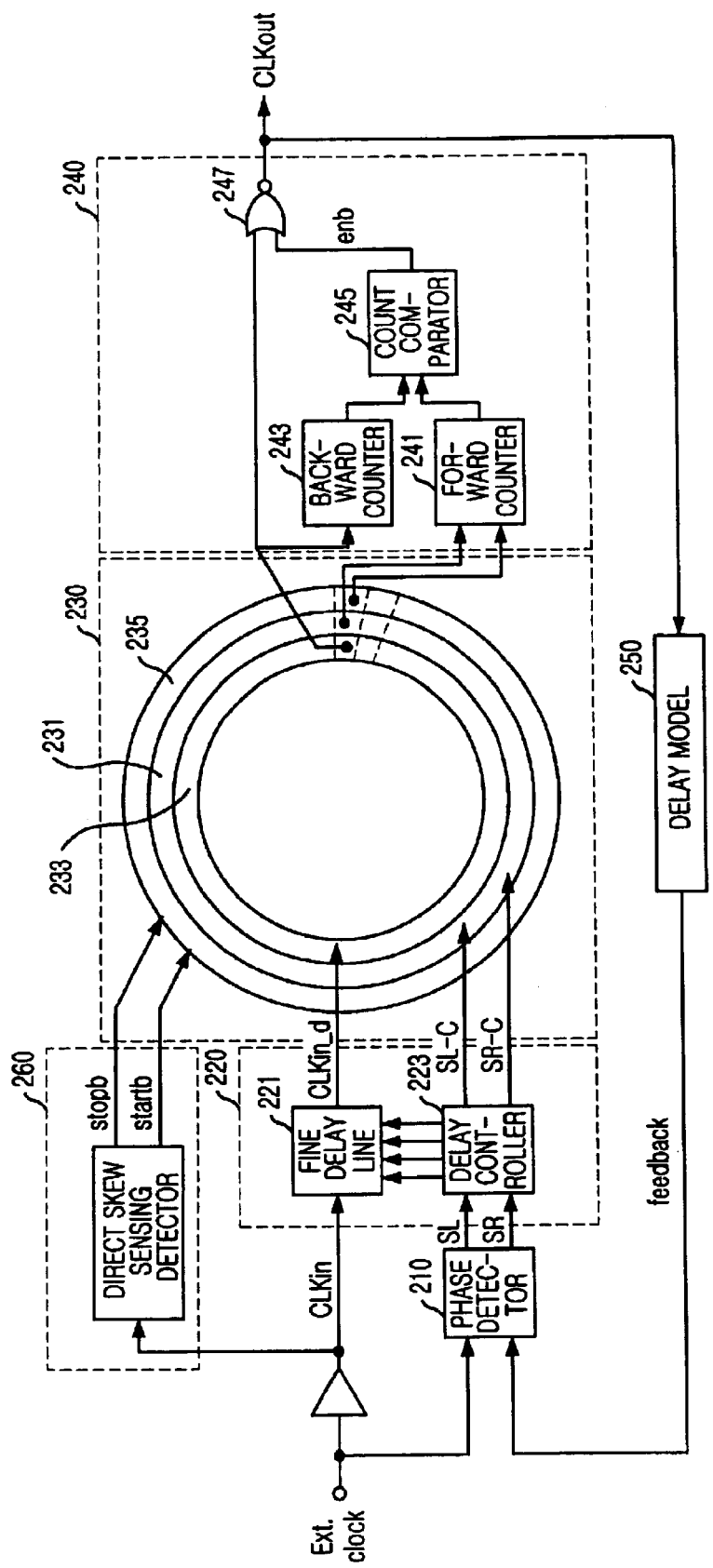
FIG. 10 is a block diagram illustrating a ring-register controlled delay locked loop in accordance with a third embodiment of the present invention.

FIG. 10 is a block diagram illustrating a ring-register controlled delay locked loop in accordance with a third embodiment of the present invention.

Configuration of the ring-register controlled delay locked loop in this embodiment is similar to that in the second embodiment except that the external clock signal is inputted to the phase detector 210 instead of the delayed internal clock signal CLKin. In this case, since it is not necessary to consider a delay in the clock receiver, which is the buffer of the delay model 250, the ring-register controlled delay locked loop can be operated in more accurate to variations of the temperature/process/voltage.

Figure 11:
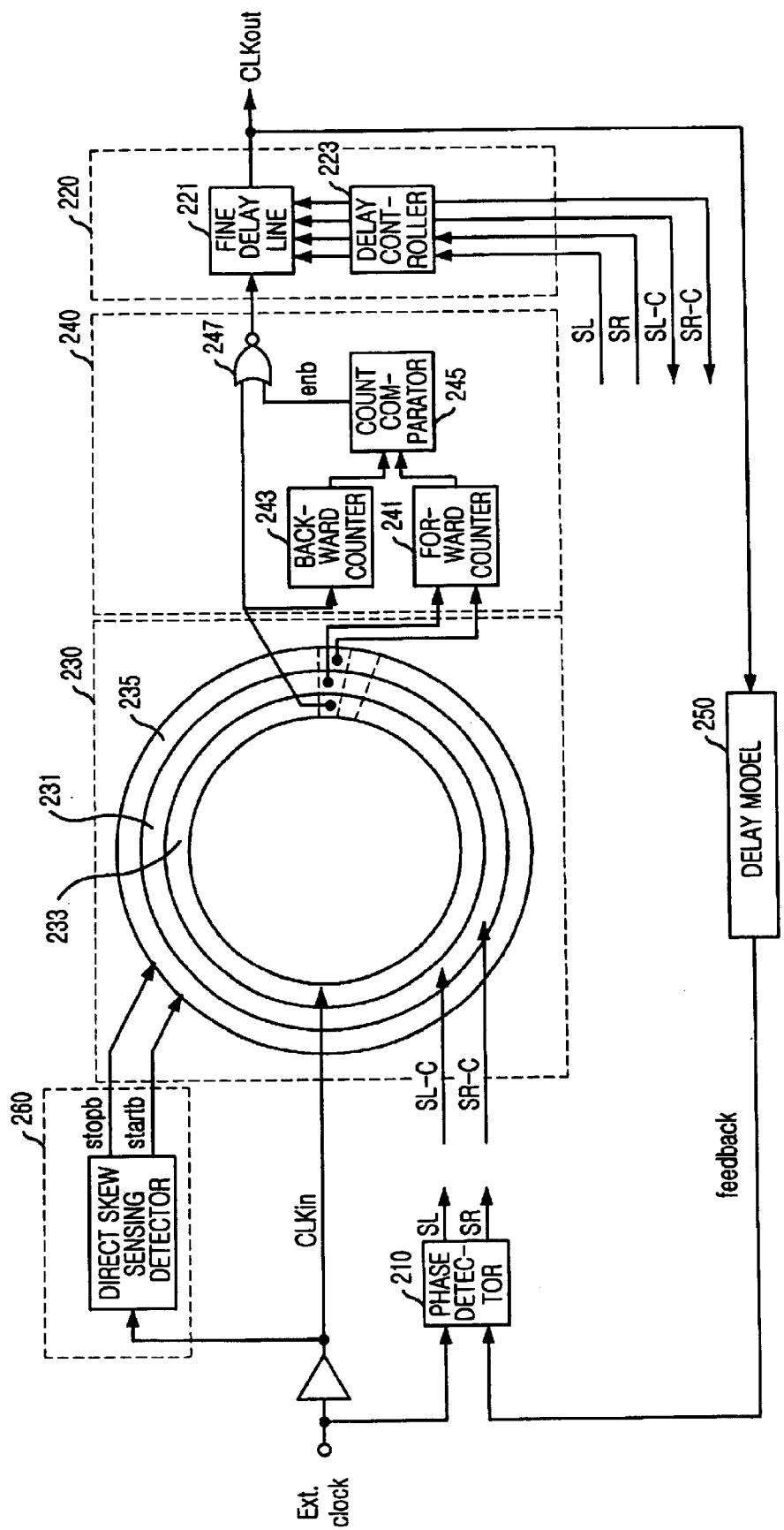
FIG. 11 is a block diagram illustrating a ring-register controlled delay locked loop in accordance with a fourth embodiment of the present invention.

FIG. 11 is a block diagram illustrating a ring-register controlled delay locked loop in accordance with a fourth embodiment of the present invention.

Configuration and operation of the ring-register controlled delay locked loop in the fourth embodiment are similar to those in the second embodiment except that the fine delay unit is placed on a different location. Therefore, for easy description, the configuration and operation of the ring-register controlled delay locked loop in this embodiment will be skipped.

Figure 12:
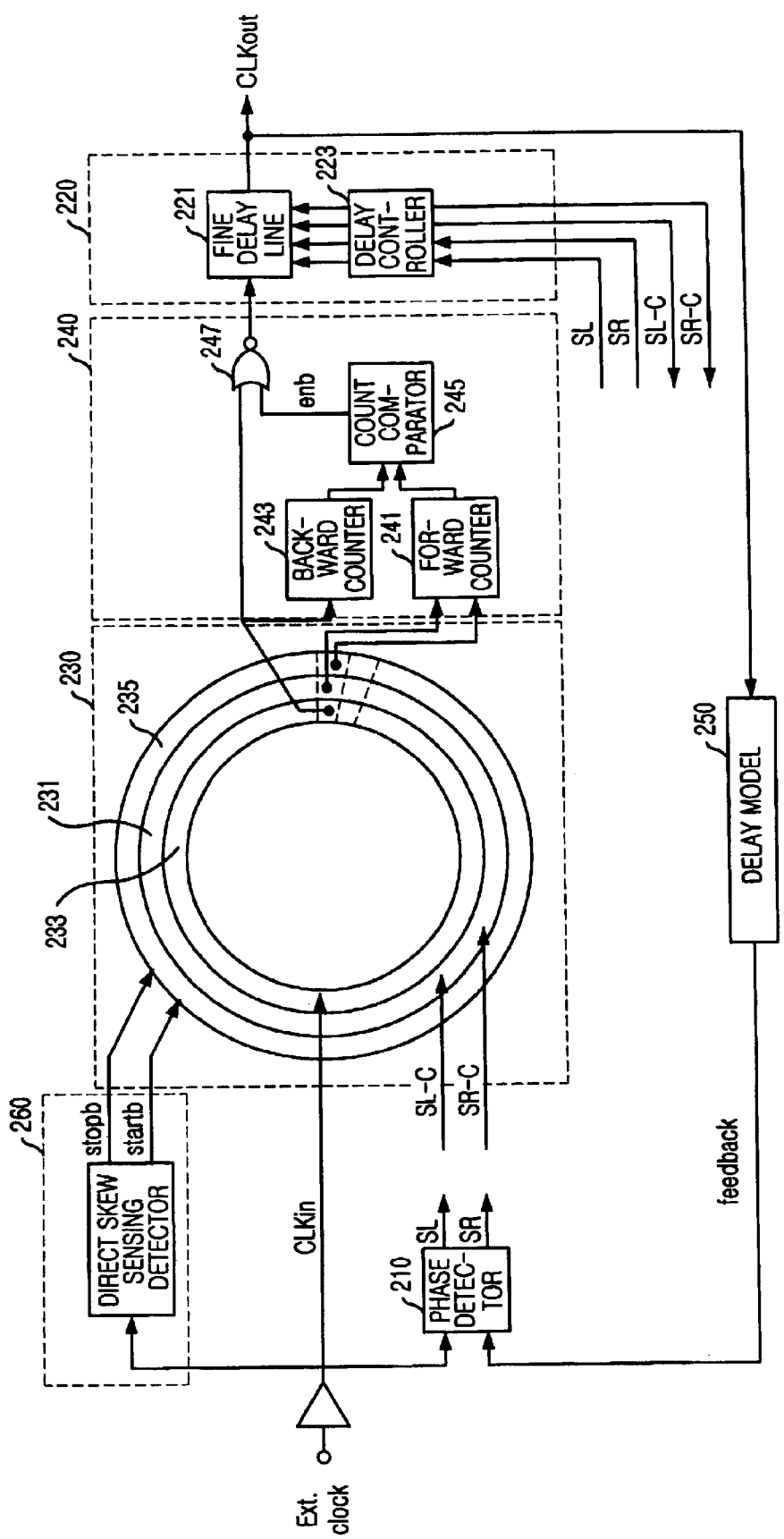
FIG. 12 is a block diagram illustrating a ring-register controlled delay locked loop in accordance with a fifth embodiment of the present invention.
Figure 13A:
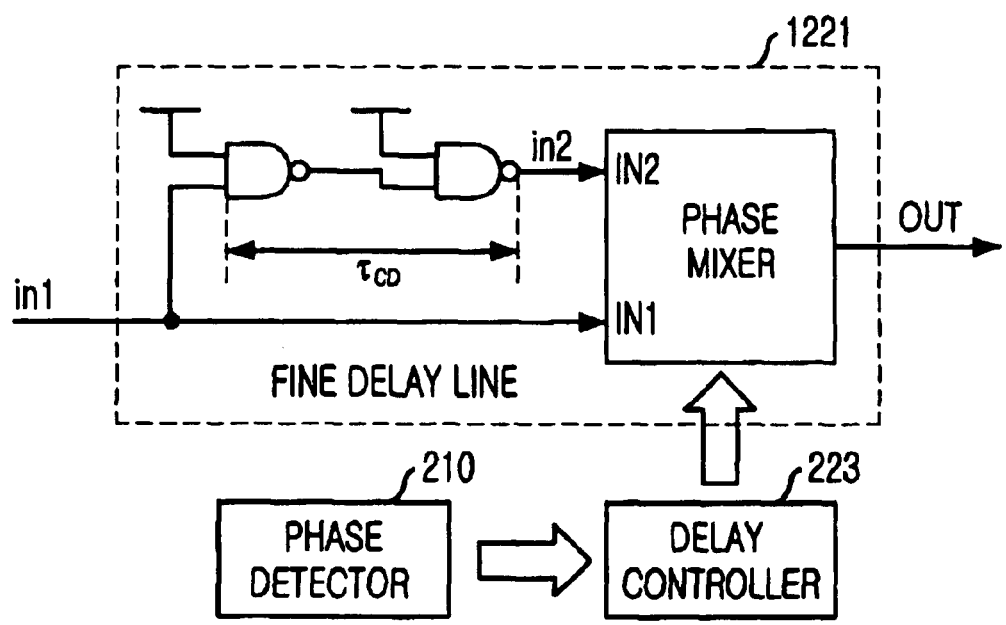
FIG. 13A is a block diagram illustrating another fine delay unit in accordance with the present invention.
Figure 13B:
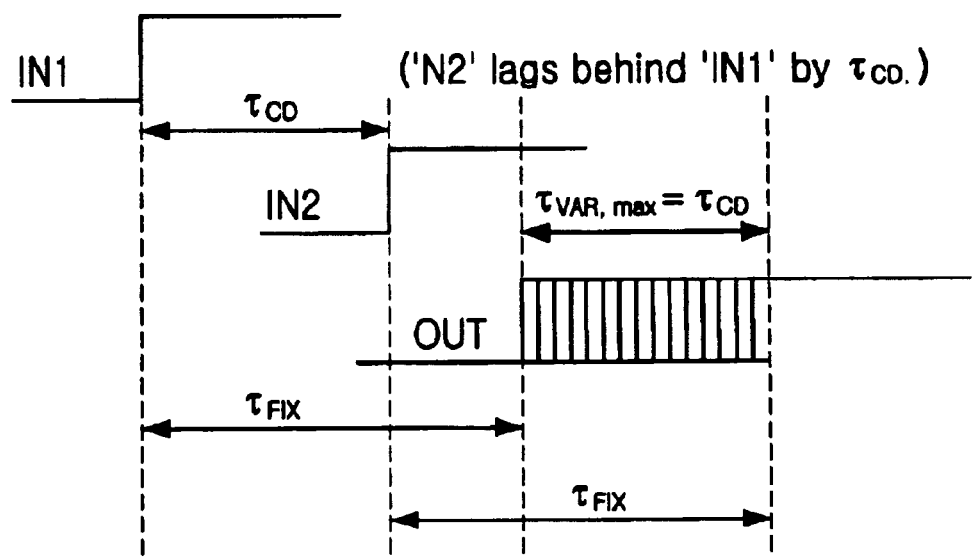
FIG. 13B is a timing chart of input/output clock signals of a phase mixer in the fine delay unit in FIG. 13A.

FIG. 12A is a block diagram illustrating another fine delay unit in accordance with the present invention; and FIG. 12B is a timing chart of input/output signals of a phase mixer in the fine delay unit in FIG. 12A.

The phase mixer in the fine delay line 221 receives two input signals each having a different phase and generates a signal of which a phase is between those of the input signals. As can be seen in FIG. 12A, in the case where the phase difference of the input signals is the coarse delay time $\tau_{CD}$, the output of the phase mixer is illustrated in FIG. 12B. Since the output signal may has the same phase as a fraction of the coarse unit delay time $\tau_{CD}$ and $\tau_{VAR,max}$ is equal to $\tau_{CD}$, the fine delay unit in this embodiment satisfies the requirements of the fine delay unit necessary for the invention.

As apparent from the above, the delay locking loop according to present invention has a simple structure, a small area, a power consumption, a good jitter characteristic and a fast delay locking time.

While the present invention has been described with respect to certain preferred embodiments, it will be apparent to those skilled in the art that various changes and modifications may be made without departing from the scope of the invention as defined in the following claims.

What is claimed is:

1. A ring-register controlled delay locked loop comprising:
   a phase detecting means for comparing an internal clock signal with an output clock signal which is fed back from an output terminal of the ring-register controlled delay locked loop and producing a control signal in order to synchronize the internal clock signal with the output clock signal;
   a fine delay means for carrying out a fine delay of the internal clock signal in response to the control signal from the phase detecting means or for bypassing the control signal from the phase detecting means;
   a coarse delay means having a plurality of unit delayers which are coupled to each other in a ring type, for coarsely delaying the internal clock signal from the fine delay means in response to the bypassed control signal;
   an output clock signal generating means for the output clock signal when a desired delay is achieved in the coarse delay means; and
   a delay model for delaying the output clock signal and transferring the delayed output clock signal to the phase detecting means.

2. The ring-register controlled delay locked loop as recited in claim 1, wherein the fine delay means includes:
   a fine delay line for delaying the internal clock signal by providing capacitive load to the internal clock signal, having a plurality of capacitors connected to a signal path of the internal clock signal; and
   a control means for selectively connecting the capacitors to the signal path of the internal clock signal in response to the control signal from the phase detecting means or for bypassing the control signal from the phase detecting means.

3. The ring-register controlled delay locked loop as recited in claim 2, wherein the coarse delay means includes:
   a backward ring delay means having a plurality of delay stages, which are circularly connected to each other, for coarsely delaying the delayed internal clock signal by the fine delay means; and
   a register means for controlling an amount of delay of the internal clock signal from the fine delay means in the circularly connected delay stages in response to the bypassed control signal from the phase detecting means.

4. The ring-register controlled delay locked loop as recited in claim 3, wherein each of the delay stages of the backward ring delay means includes:
   a first NAND gate receiving an output signal from the register means and the internal clock signal from the fine delay means;
   a second NAND gate receiving an output signal from the first NAND gate and an output signal from the circularly connected delay stage; and
   a third NAND gate receiving an output signal from the second NAND gate and a reset signal.

5. The ring-register controlled delay locked loop as recited in claim 3, wherein the coarse delay means satisfies the following relationship:

$$|\tau_{FD} - \tau_{VAR,max}| \leq \tau_{FD}$$

where $\tau_{CD}$ is a delay time in the delay stage of the coarse delay means, $\tau_{VAR,max}$ is a maximum delay time in the fine delay means, and $\tau_{CD}$ is a delay time of each capacitor in the fine delay means.

6. The ring-register controlled delay locked loop as recited in claim 3, wherein the output clock signal generating means includes:
   a backward counter connected to the backward ring delay means for counting circulation of delay of the internal clock signal;
   a forward counter connected to the register means; and
   an internal clock signal output means having a count comparator to compare count values from the backward counter and the forward counter and for outputting the circularly delayed internal clock signal.

7. A ring-register controlled delay locked loop comprising:
   a skew detecting means receiving an internal clock signal and for outputting an internal clock synchronizing signal, which is synchronized with the received internal clock, and a delayed pulse corresponding to an amount of delay in a delay model;
   a phase detecting means for comparing an external clock signal with an output clock signal which is fed back from an output terminal of the ring-register controlled delay locked loop and producing a control signal in order to synchronize the external clock signal with the output clock signal;
   a fine delay means for carrying out a fine delay of the internal clock signal in response to the control signal from the phase detecting means or for bypassing the control signal from the phase detecting means;
   a coarse delay means having a plurality of unit delayers which are coupled to each other in a ring type, for coarsely delaying the delayed internal clock signal from the fine delay means in response to the internal clock synchronizing signal and the delayed pulse from the skew detecting means and the bypassed control signal from the fine delay means;
   an output clock signal generating means for the output clock signal when a desired delay is achieved in the coarse delay means; and
   a delay model for delaying the output clock signal and transferring the delayed output clock signal to the phase detecting means.

8. The ring-register controlled delay locked loop as recited in claim 7, wherein the fine delay means includes:
   a fine delay line for delaying the internal clock signal by providing capacitive load to the internal clock signal, having a plurality of capacitors connected to a signal path of the internal clock signal; and
   a control means for selectively connecting the capacitors to the signal path of the internal clock signal in response to the control signal from the phase detecting means or for bypassing the control signal from the phase detecting means.

9. The ring-register controlled delay locked loop as recited in claim 8, wherein the coarse delay means includes:
   a forward ring delay means having a plurality of delay stages, which are circularly connected to each other, for coarsely delaying the internal clock synchronizing signal from the skew detecting means by an amount of delay in the delay model;
   a backward ring delay means having a plurality of delay stages, which are circularly connected to each other, for coarsely delaying the delayed internal clock signal by the fine delay means; and
   a register means for controlling an amount of delay of the internal clock signal from the fine delay means in the circularly connected delay stages in response to the bypassed control signal from the phase detecting means and for storing a position of the delay stage corresponding to the current circulating delay pulse.

10. The ring-register controlled delay locked loop as recited in claim 9, wherein each of the delay stages of the backward ring delay means includes:
   a first NAND gate receiving an output signal from the register means and the internal clock signal from the fine delay means;
   a second NAND gate receiving an output signal from the first NAND gate and an output signal from the circularly connected delay stage; and
   a third NAND gate receiving an output signal from the second NAND gate and a reset signal.

11. The ring-register controlled delay locked loop as recited in claim 9, wherein each of the delay stages of the forward ring delay means includes:
   a first NAND gate receiving a first output signal from the skew detecting means and an output signal from the circularly connected delay stage; and
   a second NAND gate receiving a second output signal from the first NAND gate and an output signal from the circularly connected delay stage.

12. The ring-register controlled delay locked loop as recited in claim 9, wherein the coarse delay means satisfies the following relationship:

$$|\tau_{FD}-\tau_{VAR,max}|\leq\tau_{FD}$$

where $\tau_{CD}$ is a delay time in the delay stage of the coarse delay means, $\tau_{VAR,max}$ is a maximum delay time in the fine delay means, and $\tau_{CD}$ is a delay time of each capacitor in the fine delay means.

13. The ring-register controlled delay locked loop as recited in claim 12, wherein the output clock signal generating means includes:
   a backward counter connected to the backward ring delay means for counting circulation of delay of the internal clock signal;
   a forward counter connected to the register means for counting circulation of the delayed internal clock signal in the forward ring delay means and for detecting a position of the delay stage corresponding to the current circulating pulse; and
   an internal clock signal output means having a count comparator to compare count values from the backward counter and the forward counter and for outputting the circularly delayed internal clock signal.

14. A ring-register controlled delay locked loop comprising:
   a skew detecting means receiving an internal clock signal and for outputting an internal clock synchronizing signal, which is synchronized with the received internal clock, and a delayed pulse corresponding to an amount of delay in a delay model;
   a phase detecting means for comparing the internal clock signal with an output clock signal which is fed back from an output terminal of the ring-register controlled delay locked loop and producing a control signal in order to synchronize the internal clock signal with the output clock signal;
   a fine delay means for carrying out a fine delay of the internal clock signal in response to the control signal from the phase detecting means or for bypassing the control signal from the phase detecting means;
   a coarse delay means having a plurality of unit delayers which are coupled to each other in a ring type, for coarsely delaying the delayed internal clock signal from the fine delay means in response to the internal clock synchronizing signal and the delayed pulse from the skew detecting means and the bypassed control signal from the fine delay means;
   an output clock signal generating means for the output clock signal when a desired delay is achieved in the coarse delay means; and
   a delay model for delaying the output clock signal and transferring the delayed output clock signal to the phase detecting means.

15. A ring-register controlled delay locked loop comprising:
   a skew detecting means receiving an internal clock signal and for outputting an clock synchronizing signal, which is synchronized with the received internal clock signal, and a delayed pulse corresponding to an amount of delay in a delay model;
   a phase detecting means for comparing an external clock signal with an output clock signal which is fed back from an output terminal of the ring-register controlled delay locked loop and producing a first control signal in order to synchronize the external clock signal with the output clock signal;
   a coarse delay means having a plurality of unit delayers which are coupled to each other in a ring type, for coarsely delaying the delayed internal clock signal from the fine delay means in response to the clock synchronizing signal and the delayed pulse from the skew detecting means and a second control signal;
   an output clock signal generating means for generating the output clock signal while the coarse delay is required in the coarse delay means;
   a fine delay means for carrying out a fine delay of the internal clock signal in response to the first control signal from the phase detecting means or for bypassing the first control signal from the phase detecting means and then producing the second control signal; and
   a delay model for delaying the output clock signal and transferring the delayed output clock signal to the phase detecting means.

16. A ring-register controlled delay locked loop comprising:
   a skew detecting means receiving an internal clock signal and for outputting an clock synchronizing signal, which is synchronized with the received internal clock signal, and a delayed pulse corresponding to an amount of delay in a delay model;
   a phase detecting means for comparing the internal clock signal with an output clock signal which is fed back from an output terminal of the ring-register controlled delay locked loop and producing a first control signal in order to synchronize the internal clock signal with the output clock signal;
   a coarse delay means having a plurality of unit delayers which are coupled to each other in a ring type, for coarsely delaying the delayed internal clock signal from the fine delay means in response to the clock synchronizing signal and the delayed pulse from the skew detecting means and a second control signal;
   an output clock signal generating means for generating the output clock signal while the coarse delay is required in the coarse delay means;

a fine delay means for carrying out a fine delay of the internal clock signal in response to the first control signal from the phase detecting means or for bypassing the first control signal from the phase detecting means and then producing the second control signal; and a delay model for delaying the output clock signal and transferring the delayed output clock signal to the phase detecting means.

17. The ring-register controlled delay locked loop as recited in claim 16, wherein the fine delay means includes:

a fine delay line for delaying the internal clock signal by providing capacitive load to the internal clock signal, having a plurality of capacitors connected to a signal path of the internal clock signal; and a control means for selectively connecting the capacitors to the signal path of the internal clock signal in response to the first control signal from the phase detecting means or for bypassing the first control signal from the phase detecting means.

18. The ring-register controlled delay locked loop as recited in claim 17, wherein the coarse delay means includes:

a forward ring delay means having a plurality of delay stages, which are circularly connected to each other, for coarsely delaying the internal clock synchronizing signal from the skew detecting means by an amount of delay in the delay model;

a backward ring delay means having a plurality of delay stages, which are circularly connected to each other, for coarsely delaying the internal clock signal by the fine delay means; and a register means for controlling an amount of delay of the internal clock signal from the fine delay means in the circularly connected delay stages in response to the bypassed control signal from the phase detecting means and for storing a position of the delay stage corresponding to the current circulating delay pulse.

19. The ring-register controlled delay locked loop as recited in claim 18, wherein each of the delay stages of the backward ring delay means includes:

a first NAND gate receiving an output signal from the register means and the internal clock signal from the fine delay means;

a second NAND gate receiving an output signal from the first NAND gate and an output signal from the circularly connected delay stage; and a third NAND gate receiving an output signal from the second NAND gate and a reset signal.

20. The ring-register controlled delay locked loop as recited in claim 19, wherein each of the delay stages of the forward ring delay means includes:

a first NAND gate receiving a first output signal from the skew detecting means and an output signal from the circularly connected delay stage; and a second NAND gate receiving a second output signal from the first NAND gate and an output signal from the circularly connected delay stage.

21. The ring-register controlled delay locked loop as recited in claim 18, wherein the coarse delay means satisfies the following relationship:

$$|\tau_{FD} - \tau_{VAR,max}| \leq \tau_{FD}$$

where $\tau_{CD}$ is a delay time in the delay stage of the coarse delay means, $\tau_{VAR,max}$ is a maximum delay time in the fine delay means, and $\tau_{CD}$ is a delay time of each capacitor in the fine delay means.

22. The ring-register controlled delay locked loop as recited in claim 21, wherein the output clock signal generating means includes:

a backward counter connected to the backward ring delay means for counting circulation of delay of the internal clock signal;

a forward counter connected to the register means for counting circulation of the delayed internal clock signal in the forward ring delay means and for detecting a position of the delay stage corresponding to the current circulating pulse; and an internal clock signal output means having a count comparator to compare count values from the backward counter and the forward counter and for outputting the circularly delayed internal clock signal.

23. The ring-register controlled delay locked loop as recited in claim 16, wherein the fine delay means includes:

a phase mixer for mixing the internal clock signal and a delayed internal clock signal which is delayed by a delay time in the coarse delay means and for dividing the unit delay time of the coarse delay means into a plurality of fine delay time; and a control means for selectively connecting the capacitors to the signal path of the internal clock signal in response to the first control signal from the phase detecting means or for bypassing the first control signal from the phase detecting means.

24. The ring-register controlled delay locked loop as recited in claim 23, wherein the fine delay line includes a plurality of delayers, which are in series connected to each other and each of has the same delay time as the unit delayer in the coarse delay mean.

25. A ring-register controlled delay locked loop comprising:

a first delay group including a plurality of unit delay elements which are lineally coupled to each other for delaying an input clock signal;

a second delay group including a plurality of unit delay elements which are circularly coupled to each other for delaying an output signal from the first delay group;

a first control means for determining an amount of lineal delay in the first delay group; and a second control means for determining an amount of circular delay in the first delay group.

26. The ring-register controlled delay locked loop as recited in claim 25, further comprising a skew detecting means for receiving the input clock signal and for outputting an internal clock synchronizing signal, which is synchronized with the received internal clock, and a delayed pulse corresponding to an amount of delay in a delay model.

27. The ring-register controlled delay locked loop as recited in claim 25, wherein each of the unit delay elements in the first delay group has the same delay time as each of the of unit delay elements in the second delay group.

28. A ring-register controlled delay locked loop comprising:

a first delay group including at least one unit delay element for delaying an input clock signal;

a phase modifying means for modifying an output signals from the first delay group;

a second delay group including a plurality of unit delay elements which are circularly coupled to each other for delaying an output signal from the first delay group;

a first control means for determining an amount of lineal delay in the first delay group; and a second control means for determining an amount of circular delay in the second delay group.

29. The ring-register controlled delay locked loop as recited in claim 27, further comprising a skew detecting means for receiving the input clock signal and for outputting an internal clock synchronizing signal, which is synchronized with the received internal clock, and a delayed pulse corresponding to an amount of delay in a delay model.

30. A method for generating a delay locking clock signal in a register controlled register controlled delay locked loop, the method comprising the steps:

delaying an input lock signal in a first delay group including a plurality of unit delay elements, which are lineally coupled to each other for delaying the input clock signal, in response to a first control signal determining an amount of lineal delay; and circulating and delaying an output signal from the first delay group in a second delay group including a plurality of unit delay elements, which are circularly coupled to each other, in response to a second control signal determining an amount of circular delay.

31. The method as recited in claim 30, wherein a delay time of the unit delay in the first delay group is substantially the same as that in the second delay group.

32. The method as recited in claim 30, wherein a delay time of the unit delay in the first delay group is smaller than that in the second delay group.

* * * * *